United States Patent
Kamikanna

(10) Patent No.: US 10,524,342 B2
(45) Date of Patent: *Dec. 31, 2019

(54) DROPLET COLLECTION DEVICE

(71) Applicant: Gigaphoton Inc., Tochigi (JP)

(72) Inventor: Kazukiyo Kamikanna, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/244,624

(22) Filed: Jan. 10, 2019

(65) Prior Publication Data

US 2019/0150264 A1     May 16, 2019

Related U.S. Application Data

(63) Continuation of application No. PCT/JP2016/075532, filed on Aug. 31, 2016.

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/008* (2013.01)

(58) Field of Classification Search
CPC .......... H05G 2/00; H05G 2/001; H05G 2/003; H05G 2/005; H05G 2/006; H05G 2/008; G02F 7/70908

See application file for complete search history.

(56) References Cited

U.S. PATENT DOCUMENTS

| | | | | |
|---|---|---|---|---|
| 2009/0272919 A1* | 11/2009 | Abe | ................... | G03F 7/70033 250/504 R |
| 2013/0134326 A1* | 5/2013 | Yabu | ................... | H05G 2/003 250/455.11 |
| 2016/0192470 A1* | 6/2016 | Iwamoto | ............. | G03F 7/70908 250/504 R |

(Continued)

FOREIGN PATENT DOCUMENTS

| | | |
|---|---|---|
| JP | 2000-091095 A | 3/2000 |
| JP | 2002-219324 A | 8/2002 |

(Continued)

OTHER PUBLICATIONS

International Search Report issued in PCT/JP2016/075532; dated Nov. 15, 2016.

(Continued)

*Primary Examiner* — David E Smith
(74) *Attorney, Agent, or Firm* — Studebaker & Brackett PC

(57) ABSTRACT

A droplet collection device may include a collecting container arranged on an outer wall surface side of a wall of a chamber and configured to communicate with the inside of the chamber through an opening provided at the wall of the chamber, a collision plate arranged in the collecting container and configured such that a droplet supplied from the opening to the collecting container is to collide with the collision plate, a shielding plate arranged on an opening side with respect to the collision plate and provided with a through-hole through which the droplet supplied to the collecting container passes and a wire rod bundle arranged in the through-hole of the shielding plate in a state that multiple wire rods are bundled.

13 Claims, 10 Drawing Sheets

(56) References Cited

U.S. PATENT DOCUMENTS

2016/0255709 A1* 9/2016 Iwamoto ................ H05G 2/005
                                                                          250/504 R
2016/0278195 A1* 9/2016 Kim ....................... H05G 2/006

FOREIGN PATENT DOCUMENTS

| JP | 2008-226462 A | 9/2008 |
| JP | 2013-131483 A | 7/2013 |
| WO | 2015063825 A1 | 5/2015 |
| WO | 2015097888 A1 | 7/2015 |

OTHER PUBLICATIONS

Written Opinion issued in PCT/JP2016/075532; dated Nov. 15, 2016.

\* cited by examiner

DROPLET COLLECTION DEVICE

CROSS-REFERENCE TO RELATED APPLICATIONS

The present application is a continuation application of International Application No. PCT/JP2016/075532 filed on Aug. 31, 2016. The content of the application is incorporated herein by reference in its entirety.

BACKGROUND

1. Technical Field

The present invention relates to a droplet collection device.

2. Related Art

In recent years, along with miniaturization of a semiconductor process, miniaturization of a transfer pattern in photolithography of a semiconductor process has been developed rapidly. In the next generation, fine processing of equal to or less than 20 nm will be demanded. It is expected to develop an exposure device in which a device configured to generate extreme ultraviolet (EUV) light having a wavelength of about 13 nm and reduced projection reflective optics are combined.

As an extreme ultraviolet light generation system, three types of devices have been proposed, namely a laser produced plasma (LPP) type device using plasma generated by irradiation of a target substance with laser light, a discharge produced plasma (DPP) type device using plasma generated by electric discharge, and a synchrotron radiation (SR) type device using orbital radiation light.
[Patent Literature 1] JP 2002-219324 A
[Patent Literature 2] WO 2015/097888 A

SUMMARY

A droplet collection device according to one aspect of the present disclosure may include a collecting container, a collision plate, a shielding plate, and a wire rod bundle. The collecting container may be arranged on an outer wall surface side of a wall of a chamber and configured to communicate with the inside of the chamber through an opening provided at the wall of the chamber. The collision plate may be arranged in the collecting container and configured such that a droplet supplied from the opening to the collecting container is to collide with the collision plate. The shielding plate may be arranged on an opening side with respect to the collision plate and provided with a through-hole through which the droplet supplied to the collecting container passes. The wire rod bundle may be arranged in the through-hole of the shielding plate in a state that multiple wire rods are bundled.

BRIEF DESCRIPTION OF THE DRAWINGS

Some embodiments of the present disclosure will be described below as mere examples with reference to the accompanying drawings.

DETAILED DESCRIPTION

1. Overview
2. Description of extreme ultraviolet light generation system
    2.1 Overall configuration
    2.2 Operation
3. Comparative example
    3.1 Configuration of droplet collection device
    3.2 Operation
    3.3 Disadvantage
4. First embodiment
    4.1 Configuration of droplet collection device
    4.2 Operation
    4.3 Feature/advantageous effect
5. Second embodiment
    5.1 Configuration of droplet collection device
    5.2 Operation
    5.3 Feature/advantageous effect
6. Variations Hereinafter, embodiments of the present disclosure will be described in detail with reference to the drawings.

The embodiments described below illustrate some examples of the present disclosure, and do not limit the contents of the present disclosure. All of configurations and operations described in each embodiment are not always indispensable as configurations and operations of the present disclosure.

Note that the same components are denoted by the same reference signs, and overlapping description is omitted.

1. Overview

Each embodiment of the present disclosure relates to an extreme ultraviolet light generation system configured to generate light with a wavelength called extreme ultraviolet (EUV). Note that in the present specification, the extreme ultraviolet light will be hereinafter sometimes referred to as "EUV light".

2. Description of Extreme Ultraviolet Light Generation System

2.1 Overall Configuration

Figure 1:
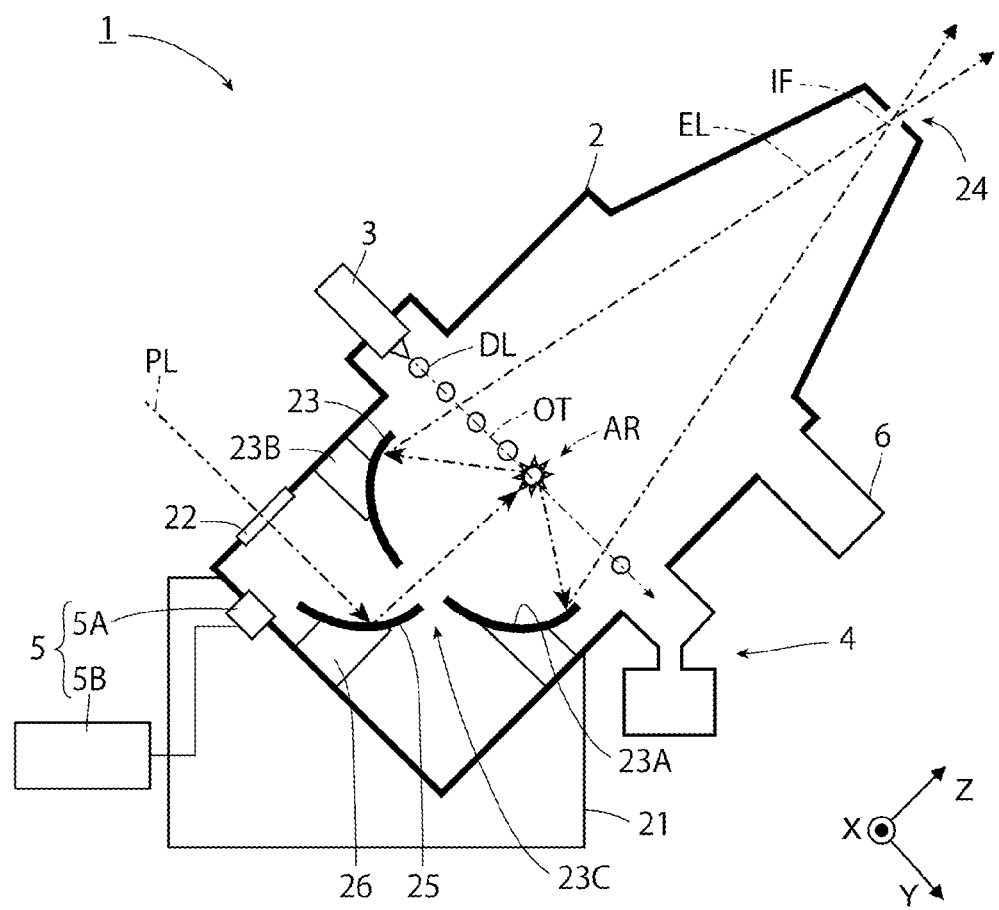
FIG. 1 is a schematic view of an outline configuration example of an entire extreme ultraviolet light generation system.

As illustrated in FIG. 1, an extreme ultraviolet light generation system 1 of the present embodiment includes a chamber 2, a droplet supply device 3, a droplet collection device 4, an etching gas supply device 5, and an exhaust device 6.

The chamber 2 is a container which can be sealed and depressurized, and is held by a chamber holder 21. A wall of the chamber 2 has at least one through-hole, and the through-hole is closed by a window 22. The window 22 allows transmission of pulse laser light PL emitted from a laser device (not shown) arranged outside the chamber 2.

In the chamber 2, a predetermined region including part of a trajectory OT of a droplet DL supplied into the chamber 2 is a plasma generation region AR where the droplet DL is converted into plasma.

Moreover, in the chamber 2, a light focusing mirror 23 having a rotary oval reflection surface 23A is held, for example, by a mirror holder 23B fixed to the wall of the chamber 2. The light focusing mirror 23 is configured to reflect EUV light EL, contained in light generated due to conversion of the droplet DL into the plasma in the plasma generation region AR on the reflection surface 23A to focus light, on a focal point, thereby emitting the resultant light to an exposure device (not shown) through an output port 24 of the chamber 2. The focal point of the light focusing mirror 23 may include a first focal point and a second focal point. For example, the first focal point is positioned in the plasma generation region AR, and the second focal point is positioned at an intermediate focal point IF as a light focusing position defined according to, e.g., specifications of the exposure device (not shown). Note that at the light focusing mirror 23 may have a through-hole 23C through which the pulse laser light PL propagating from the window 22 into the chamber 2 passes.

Moreover, in the chamber 2, a laser light focusing optical system 25 configured to focus, on the plasma generation region AR, the pulse laser light PL propagating from the window 22 into the chamber 2 is provided. For example, the laser light focusing optical system 25 is fixed to a plate 26 arranged on the opposite side of the light focusing mirror 23 from the reflection surface 23A, and focuses the pulse laser light PL, which has propagated from the window 22 into the chamber 2, on the plasma generation region AR through the through-hole 23C of the light focusing mirror 23. Note that the plate 26 may be configured movable in three axis directions, and the plate 26 may be moved such that a light focusing position in the plasma generation region AR by the laser light focusing optical system 25 is changed.

The droplet supply device 3 is a device configured to supply, as the droplet DL, a target substance as a substance targeted for conversion into the plasma in the plasma generation region AR into the chamber 2, and for example, is attached to penetrate the wall of the chamber 2. A material of the target substance supplied from the droplet supply device 3 may include, but not limited to, any of tin, terbium, gadolinium, lithium, and xenon or a combination of any two or more of these materials.

The droplet collection device 4 is a device configured to collect droplets DL not converted into the plasma in the plasma generation region AR among droplets DL supplied into the chamber 2. For example, the droplet collection device 4 is provided on the outside of the chamber 2 on a side opposite to the wall of the chamber 2 to which the droplet supply device 3 is attached.

The etching gas supply device 5 is a device configured to supply, into the chamber 2, gas to be reacted with debris and ion generated by conversion of the droplet DL into the plasma. For example, the etching gas supply device 5 may include a gas generation unit 5B and a gas introduction unit 5A configured to introduce gas generated in the gas generation unit 5B into the chamber 2. In a case where the material of the droplet DL as the target substance is tin, gas supplied from the etching gas supply device 5 is, e.g., hydrogen gas or gas containing hydrogen. In this case, fine tin particles and tin ion generated by conversion of the droplet DL into the plasma react with hydrogen, and are converted into stannane gas at room temperature.

The exhaust device 6 is a device configured to discharge residual gas from the chamber 2. The residual gas discharged by the exhaust device 6 contains the debris and the ion, a product generated by reaction of the debris and the ion with etching gas, and unreacted etching gas. Note that the exhaust device 6 may discharge the same amount of residual gas as the amount of etching gas supplied from the etching gas supply device 5 into the chamber 2, and may maintain the internal pressure of the chamber 2 substantially constant.

2.2 Operation

The pulse laser light PL emitted from the laser device (not shown) propagates to the laser light focusing optical system 25 in the chamber 2 through the window 22, and is focused on the plasma generation region AR by the laser light focusing optical system 25. Moreover, the droplet DL supplied from the droplet supply device 3 into the chamber 2 passes through the plasma generation region AR including part of the trajectory OT of the droplet DL.

Some of the droplets DL passing through the plasma generation region AR are irradiated with the pulse laser light PL focused by the laser light focusing optical system 25, and the other droplets DL are not irradiated with the pulse laser light PL, but are collected by the droplet collection device 4.

The droplet DL irradiated with the pulse laser light PL is converted into the plasma, and the light including the EUV light EL is emitted from the plasma. The EUV light EL is selectively reflected on the reflection surface 23A of the light focusing mirror 23, and then, is emitted to the exposure device (not shown) outside the chamber 2.

In a case where the droplet DL is converted into the plasma, the light including the EUV light EL is emitted, and the debris and the ion are diffused. Part of the debris and the ion react with the etching gas supplied from the etching gas supply device 5 into the chamber 2, and therefore, are converted into gas. Thus, sputtering due to debris accumulation on the window 22 or the reflection surface 23A of the light focusing mirror 23 and ion collision with the window 22 or the reflection surface 23A of the light focusing mirror 23 is reduced.

The etching gas, the gas resulting from a change due to reaction with the etching gas, and the debris and the ion unreacted with the etching gas are discharged by the exhaust device 6. This suppresses these substances from remaining in the chamber 2.

Note that after the droplet DL reaching the plasma generation region AR has been irradiated with prepulse laser light and the target substance has been diffused, such a diffused target substance might be irradiated with main pulse laser light, and might be converted into the plasma. In this case, a conversion efficiency (CE) from energy of the laser light into energy of the EUV light EL can be improved.

3. Comparative Example

3.1 Configuration of Droplet Collection Device

Next, a configuration of a droplet collection device as a comparative example of the following embodiments will be described. Note that the same reference signs are used to represent configurations similar to those described above, and unless otherwise described, overlapping description is omitted.

Figure 2:
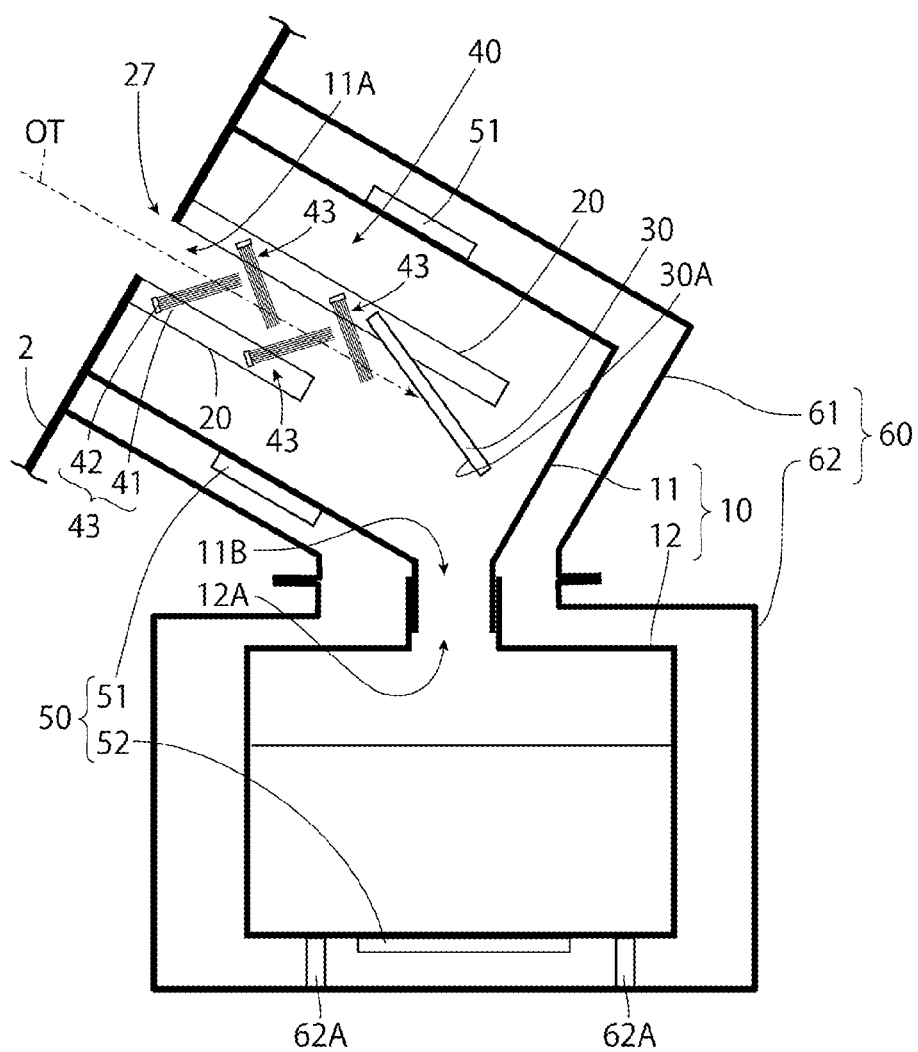
FIG. 2 is a schematic view of an outline configuration example of a droplet collection device of a comparative example.
Figure 3:
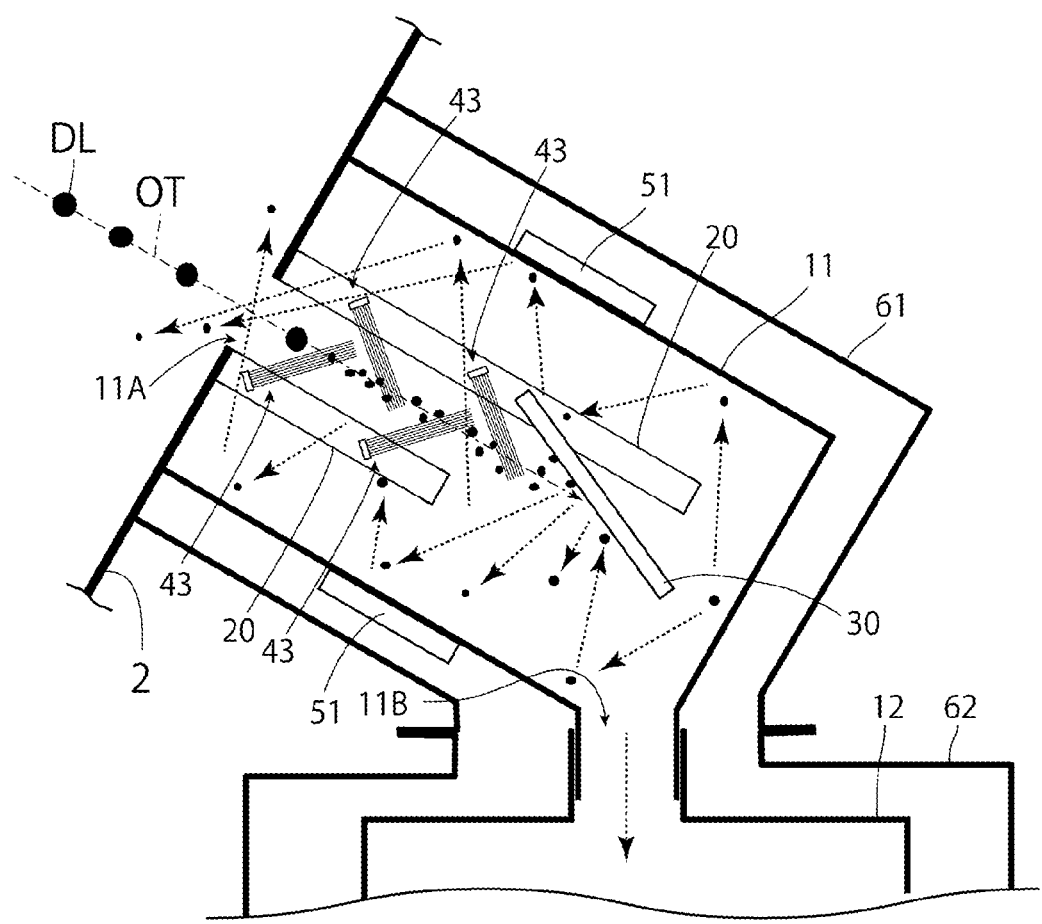
FIG. 3 is a view of a state when a droplet is collected by the droplet collection device of the comparative example.

As illustrated in FIG. 2, the droplet collection device of the comparative example includes a collecting container 10, a holder frame 20, a collision plate 30, a buffer member 40, a heater 50, and a covering case 60.

The collecting container 10 is a container configured to collect the droplet DL not converted into the plasma in the plasma generation region AR, and is arranged on an outer wall surface side of the wall of the chamber 2. Moreover, the collecting container 10 is a container which can be sealed and depressurized, and the inside of the collecting container 10 communicates with the inside of the chamber 2 through an opening 27 provided at the wall of the chamber 2. The collecting container 10 may be molded integrally with the chamber 2, or may be formed separately from the chamber 2 and may be fixed to the chamber 2 with a predetermined fixture.

For example, the collecting container 10 may include an absorber portion 11 and a tank portion 12. The absorber portion 11 is a container portion configured to mitigate collision due to collision of the droplet DL supplied from the opening 27 of the chamber 2. The tank portion 12 is a container portion configured to store small droplets of the droplet DL crushed due to collision of the droplet DL.

The absorber portion 11 has an inlet-side opening 11A and an outlet-side opening 11B. The inlet-side opening 11A is provided on the trajectory OT of the droplet DL, and faces the opening 27 of the chamber 2. The outlet-side opening 11B is positioned on the lowermost side on the opposite side of the opening 27 of the chamber 2, and is formed, for example, in a tubular shape. The tank portion 12 has an opening 12A at an upper position in a case where the tank portion 12 is placed, and is formed, for example, in a tubular shape.

The outlet-side opening 11B of the absorber portion 11 is formed capable of being inserted and fitted in the opening 12A of the tank portion 12. In a case where the outlet-side opening 11B of the absorber portion 11 is fitted in the opening 12A of the tank portion 12, an internal space of the absorber portion 11 and an internal space of the tank portion 12 communicate with each other. Note that a fitting portion between the opening 11B and the opening 12A may be sealed. Alternatively, the absorber portion 11 and the tank portion 12 may be formed integrally such that the internal space of the absorber portion 11 and the internal space of the tank portion 12 communicate with each other.

The holder frame 20 is a frame member configured to hold the collision plate 30 and the buffer member 40. For example, the holder frame 20 includes a rectangular plate-shaped member, and is arranged along the trajectory OT of the droplet DL with a predetermined distance from the trajectory OT. The holder frame 20 is fixed to, e.g., a wall of the absorber portion 11.

The collision plate 30 is a member provided in the absorber portion 11 of the collecting container 10 and configured to cause the droplet DL supplied from the opening 27 of the chamber 2 to the collecting container 10 to collide with the collision plate 30. The collision plate 30 is arranged inclined with respect to the trajectory OT of the droplet DL in a direction away from the opening 27 of the chamber 2, and is fixed to the holder frame 20. Of the collision plate 30, a collision surface 30A as a surface targeted for collision with the droplet DL faces the outlet-side opening 11B of the absorber portion 11. A material of the collision plate 30 includes alloy such as SUS.

The buffer member 40 is a member configured to mitigate impact of the droplet DL colliding with the collision plate 30. For example, the buffer member 40 includes wire rod bundles 43 each configured such that multiple wire rods 41 are bundled with a fixture 42.

The wire rod 41 and the fixture 42 are made of materials exhibiting high thermal conductivity and being less chemically reactive with the droplet DL. Specifically, for example, the fixture 42 is made of alloy such as SUS, and the wire rod 41 is made of carbon fibers exhibiting higher thermal conductivity than that of the fixture 42.

One end side of the wire rod bundle 43 is arranged at the holder frame 20, and is fixed to the holder frame 20 through the fixture 42 of the wire rod bundle 43. The other end side of the wire rod bundle 43 is not fixed to the holder frame 20, and therefore, is a free end. Moreover, the other end side of the wire rod bundle 43 has a portion positioned on the trajectory OT of the droplet DL. The wire rod bundles 43 are inclined with respect to the trajectory OT of the droplet DL, and are each arranged such that the free end side of each wire rod 41 of the wire rod bundles 43 is away from the opening 27 of the chamber 2.

One wire rod bundle 43 or two or more wire rod bundles 43 may be provided. In a case where two or more wire rod bundles 43 are provided, the wire rod bundles 43 are fixed at different positions of the holder frame 20, and a direction in which the wire rods 41 extend is different among the wire rod bundles 43. For example, as illustrated in FIG. 2, the wire rod bundles 43 are arranged alternately on one side and the other side with respect to a boundary which is a plane including the trajectory OT of the droplet DL. As in the collision plate 30, one of the wire rod bundles 43 closest to the collision plate 30 faces, at a free end side of the wire rods 41, the outlet-side opening 11B of the absorber portion 11. Note that the plane including the trajectory OT is a plane perpendicular to the plane of paper in an example illustrated in FIG. 2. However, as long as the plane is a reference indicating the boundary, the plane is not necessarily perpendicular to the plane of paper.

The heater 50 is configured to heat the collecting container 10 such that the internal temperature of the collecting container 10 reaches equal to or higher than the melting point of the droplet DL. For example, the heater 50 may include an absorber heater 51 provided at an outer wall of the absorber portion 11 of the collecting container 10, and a tank heater 52 provided at an outer wall of the tank portion 12 of the collecting container 10.

The covering case 60 is a case configured to cover the collecting container 10 with a space. For example, the covering case 60 may include an absorber case 61 configured to cover the absorber portion 11 of the collecting container 10, and a tank case 62 configured to cover the tank portion 12 of the collecting container 10. The absorber case 61 and the tank case 62 may be configured separatable from each other, or may be integrated. The covering case 60 suppresses release of heat to the atmosphere, the heat being generated from the heater 50 attached to the collecting container 10. Thus, a heating efficiency by the heater 50 is improved. Note that a tank holder 62A may be provided at the tank case 62.

3.2 Operation

When the heater 50 is driven, a wall surface of the collecting container 10 is held at equal to or higher than the melting point of the droplet DL by the heater 50. For example, in a case where the material of the droplet DL is tin, a set temperature at the heater 50 is set within a range of 240° C. to 400° C. In a case where this set temperature is set at 370° C. and the wire rods 41 of each wire rod bundle 43 are formed from carbon fibers, the temperature of the wall surface of the collecting container 10 is held at approximately 370° C., and the wire rods 41 arranged in the collecting container 10 are at about 290° C. In this state, the wire rods 41 arranged in the collecting container 10 are heated by heat transfer from the fixture 42 through the holder frame 20 and radiation from the absorber portion 11.

Figure 5:
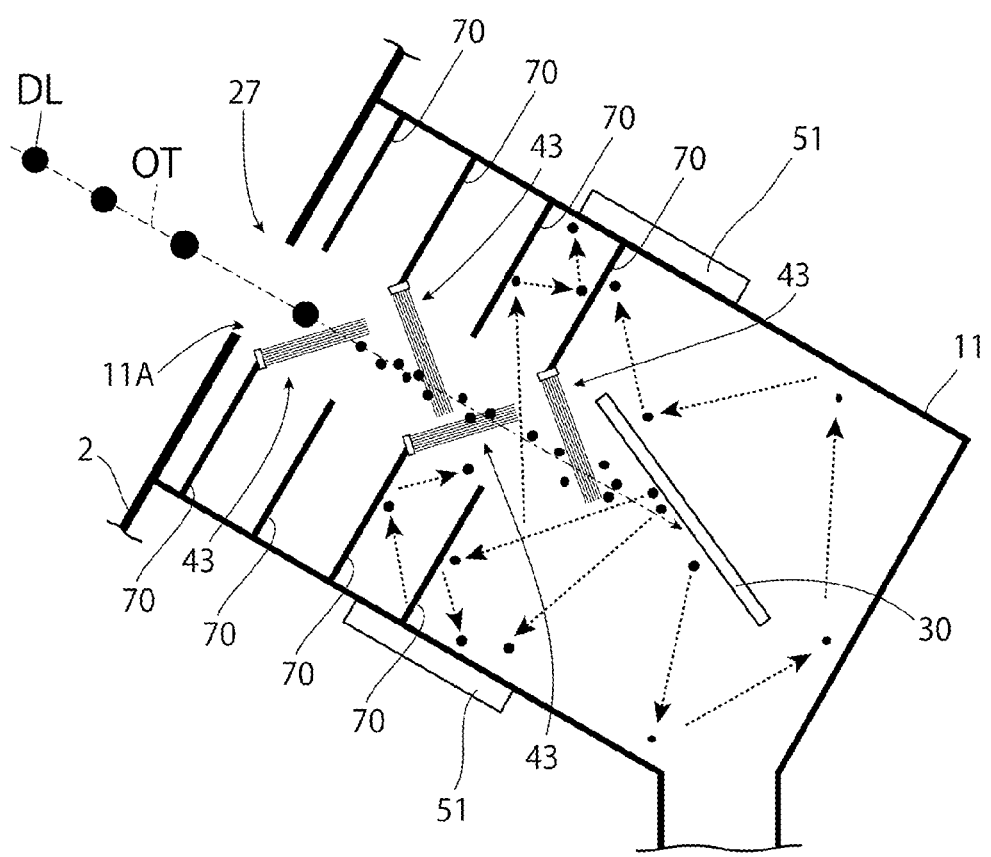
FIG. 5 is a view of a state when a droplet is collected by the droplet collection device of the first embodiment.

The droplet DL with a speed of, e.g., about 30 to 120 m/s is supplied to the collecting container 10 held at a temperature equal to or higher than the melting point of the droplet DL. As illustrated in FIG. 5, the droplet DL having entered the absorber portion 11 through the inlet-side opening 11A of the absorber portion 11 comes into collision with the wire rods 41 of the wire rod bundle 43. The droplet DL collides with the wire rods 41, and therefore, motion energy of the droplet DL decreases. Thus, impact upon collision of the droplet DL with the collision plate 30 is mitigated. In a case where there are two or more wire rod bundles 43, the number of times of passage through the wire rod bundle 43 increases as the droplet DL travels toward a terminal end side of the trajectory OT of the droplet DL. In this case, the motion energy of the droplet DL decreases as the droplet DL travels toward the terminal end side of the trajectory OT.

The droplet DL colliding with the wire rods 41 of the wire rod bundle 43 is crushed into small droplets, and these small droplets travel while dispersing to the periphery of the trajectory OT of the droplet DL. In a case where there are two or more wire rod bundles 43, the number of times of passage through the wire rod bundle 43 increases as the droplet DL travels toward the terminal end side of the trajectory OT of the droplet DL. In this case, the droplet DL is more finely crushed as the droplet DL travels toward the terminal end side of the trajectory OT.

The small droplets with smaller motion energy collide with the collision plate 30, and therefore, become finer. Part of these droplets drop into the tank portion 12 through the outlet-side opening 11B of the absorber portion 11. The wire rod bundles 43 and the collision plate 30 of the absorber portion 11 are arranged on a traveling path of the droplet DL until the tank portion 12. Thus, as compared to a case where the droplet DL directly travels into the tank portion 12, scattering of the small droplets from the tank portion 12 is reduced.

3.3 Disadvantage

There are some cases where some small droplets are scattered in the absorber portion 11 without dropping into the tank portion 12 from the collision plate 30 and part of these small droplets are diffused from the absorber portion 11 to the chamber 2.

In a case where the small droplets are diffused to the chamber 2, these small droplets react with the etching gas, or are discharged by the exhaust device 6 in an unreacted state. However, there is a probability that the small droplets diffused from the absorber portion 11 to the chamber 2 adhere to the light focusing mirror 23, the laser light focusing optical system 25, etc. without being discharged by the exhaust device 6.

There is a concern that when the small droplets adhere to an optical device such as the light focusing mirror 23 or the laser light focusing optical system 25, reflectance or transmittance of the optical device changes, and the output of the EUV light EL decreases or no EUV light EL is generated.

For this reason, in the embodiments below, the droplet collection device configured so that diffusion of the small droplets of the droplet DL to the chamber 2 can be reduced will be described as an example.

4. First Embodiment

4.1 Configuration of Droplet Collection Device

Next, a partial configuration in a droplet collection device will be described as a first embodiment. Note that the same reference signs are used to represent configurations similar to those described above, and unless otherwise stated, overlapping description is omitted.

Figure 4:
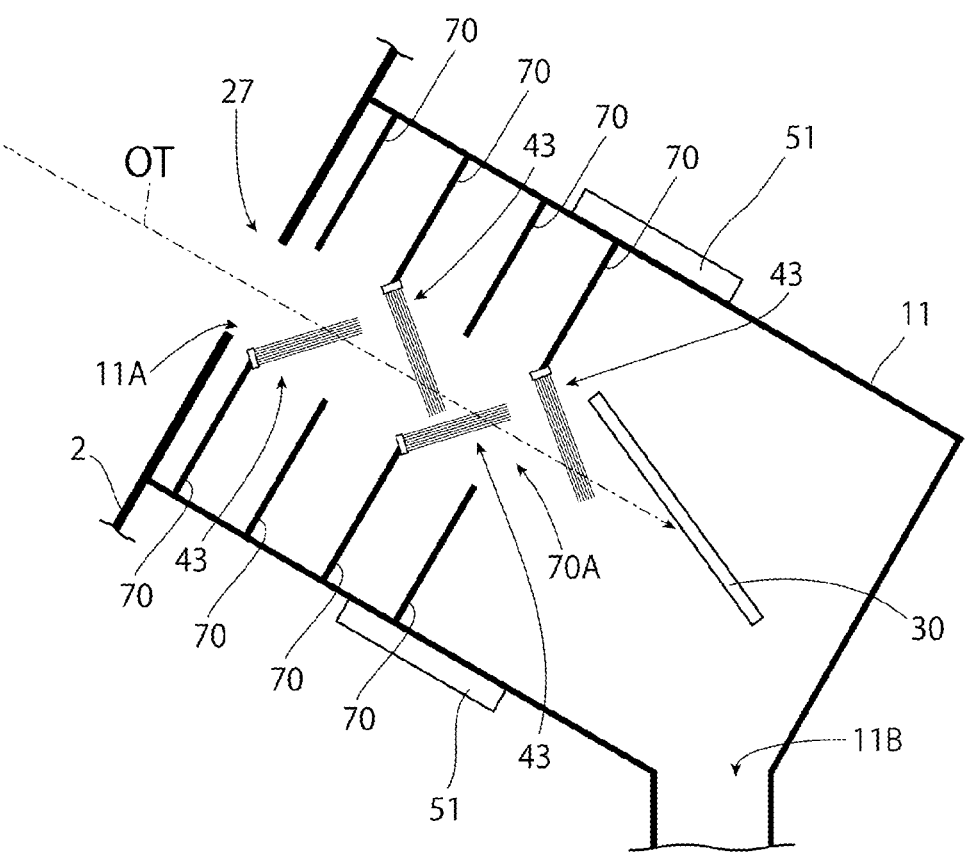
FIG. 4 is a schematic partial view of an outline configuration example of a droplet collection device of a first embodiment.

As illustrated in FIG. 4, a holder frame 20 is omitted from an absorber portion 11 in the droplet collection device of the present embodiment, and shielding plates 70 are newly provided.

The shielding plate 70 is a plate-shaped member arranged closer to an opening 27 of a chamber 2 with respect to a collision plate 30. Each shielding plate 70 has a through-hole 70A, and a droplet DL supplied to the absorber portion 11 of a collecting container 10 passes through the through-hole 70A. The shielding plate 70 is made of a material whose angle of contact with the droplet DL is equal to or less than 90°. Specifically, such a material may be, for example, alloy such as SUS or copper. In addition, the material of the shielding plate 70 includes, for example, metal such as nickel, tungsten, molybdenum, tantalum, chromium, and titanium.

Each shielding plate 70 described above is arranged to block a path in which small droplets of the droplet DL generated by collision with the collision plate 30 or a wire rod bundle 43 are diffused to the chamber 2. For example, each shielding plate 70 is arranged along a direction substantially perpendicular to a trajectory OT of the droplet DL, and an outer peripheral portion of such a shielding plate 70 closely contacts an inner wall of the absorber portion 11 of the collecting container 10. Note that the outer peripheral portion of the shielding plate 70 may be arranged with a clearance from the inner wall of the absorber portion 11 of the collecting container 10.

The wire rod bundle 43 is arranged in the through-hole 70A of the shielding plate 70, and is fixed to the shielding plate 70. For example, one end side of the wire rod bundle 43 is fixed to a peripheral edge portion of the through-hole 70A of the shielding plate 70 through a fixture 42 of the wire rod bundle 43. The other end side of the wire rod bundle 43 is not fixed to the shielding plate 70, and therefore, is a free end. Moreover, the other end side of the wire rod bundle 43 has a portion positioned on the trajectory OT of the droplet DL. The wire rod bundles 43 are inclined with respect to the trajectory OT of the droplet DL, and are each arranged such that the free end side of each wire rod 41 is away from the opening 27 of the chamber 2.

One shielding plate 70 or two or more shielding plates 70 may be provided. In a case where two or more shielding plates 70 are provided, the shielding plates 70 are arranged along the direction substantially perpendicular to the trajectory OT of the droplet DL at mutually different positions on the trajectory OT of the droplet DL as illustrated, for example, in FIG. 4. Moreover, the wire rod bundle 43 is arranged in the through-hole 70A of each shielding plate 70. A direction in which the wire rods 41 of the wire rod bundle 43 extend is different among the wire rod bundles 43 arranged in the respective through-holes 70A. For example, as illustrated in FIG. 4, the wire rod bundles 43 may be alternately arranged on one side and the other side with respect to a boundary which is a plane including the trajectory OT of the droplet DL. Note that the plane including the trajectory OT is a plane perpendicular to the plane of paper in an example illustrated in FIG. 4. However, as long as the plane is a reference indicating the boundary, the plane is not necessarily perpendicular to the plane of paper.

4.2 Operation

The temperature of a wall surface of the absorber portion 11 is held at a temperature equal to or higher than the melting point of the droplet DL by an absorber heater 51, and the droplet DL is supplied to the absorber portion 11 at a speed of, for example, about 30 to 120 m/s.

As illustrated in FIG. 5, the droplet DL having entered the absorber portion 11 through an inlet-side opening 11A of the absorber portion 11 comes into collision with the wire rods 41 of the wire rod bundle 43 arranged in the through-hole 70A of the shielding plate 70. Accordingly, motion energy of the droplet DL decreases, and impact of the droplet DL upon collision with the collision plate 30 is mitigated. In a case where two or more shielding plates 70 are arranged at mutually different positions on the trajectory OT of the droplet DL, the number of times of passage of the droplet DL through the through-hole 70A of the shielding plate 70 increases, and therefore, the motion energy further decreases.

The droplet DL colliding with the wire rods 41 of the wire rod bundle 43 is crushed into the small droplets, and these small droplets travel. In a case where two or more shielding plates 70 are arranged at mutually different positions on the trajectory OT of the droplet DL, the number of times of passage of the droplet DL through the wire rod bundles 43 arranged at these positions increases, and therefore, the droplet DL is crushed more finely.

The small droplets with smaller motion energy collide with the collision plate 30, and therefore, become finer. Part of these droplets drop into a tank portion 12 through an outlet-side opening 11B of the absorber portion 11. For the small droplets scattered in the absorber portion 11 without dropping into the tank portion 12 from the collision plate 30, trajectories toward the opening 27 of the chamber 2 are blocked by the shielding plates 70. Thus, these small droplets adhere to the shielding plate 70 or the wall of the absorber portion 11.

4.3 Feature/Advantageous Effect

As described above, in the droplet collection device of the present embodiment, the collision plate 30 is arranged in the absorber portion 11 of the collecting container 10 communicating with the inside of the chamber 2 through the opening 27 provided at a wall of the chamber 2, and the shielding plates 70 are arranged closer to the opening 27 with respect to the collision plate 30.

Thus, even when the small droplets generated due to collision with the collision plate 30 are scattered around in the absorber portion 11, the shielding plates 70 block the trajectories of the small droplets toward the opening 27 of the chamber 2. Thus, the droplet collection device of the present embodiment can reduce diffusion of the small droplets into the chamber 2.

In the case of the present embodiment, the outer peripheral portion of the shielding plate 70 closely contacts the inner wall of the absorber portion 11 of the collecting container 10. Thus, there are no small droplets moving toward the opening 27 of the chamber 2 through a clearance between the outer peripheral portion of each shielding plate 70 and the inner wall of the absorber portion 11, and as a result, diffusion of the small droplets into the chamber 2 is further reduced.

Moreover, in the case of the present embodiment, the shielding plate 70 is made of such a material that the angle of contact with the droplet DL is equal to or less than 90°. Thus, the small droplets easily adhere to the shielding plate 70, and as a result, diffusion of the small droplets into the chamber 2 is further reduced.

Further, in the case of the present embodiment, the wire rod bundle 43 having the bundled wire rods 41 is arranged in the through-hole 70A of each shielding plate 70. Thus, not only the wire rod bundle 43 decreases the motion energy of the droplet DL by collision of the droplet DL, but also serves as a shielding material configured to block the small droplets DL with small motion energy obtained by such collision from passing through the through-hole 70A toward the opening 27. As a result, diffusion of the small droplets into the chamber 2 is further reduced.

In addition, in the case of the present embodiment, one end side of the wire rod bundle 43 is fixed to the shielding plate 70. Thus, not only the shielding plate 70 blocks the trajectory of the small droplets toward the opening 27 of the chamber 2, but also serves as a holder of the buffer member 40. Thus, in the droplet collection device of the present embodiment, the number of components can be reduced.

Moreover, in the case of the present embodiment, the wire rod bundle 43 is inclined with respect to the trajectory OT of the droplet DL, and is arranged such that the other end side of the wire rod bundle 43 is away from the opening 27 of the chamber 2. Thus, the wire rod bundle 43 can decrease the motion energy of the droplet DL by collision of the droplet DL while lowering the degree of crushing the droplet DL upon such collision.

Further, in the case of the present embodiment, the shielding plates 70 are arranged at mutually different positions on the trajectory OT of the droplet DL supplied to the absorber portion 11 of the collecting container 10. The wire rod bundles 43 are arranged in the through-holes 70A of the shielding plates 70, respectively. Thus, the motion energy of the small droplets of the droplet DL is further decreased, so that the amount of small droplets scattered in the absorber portion 11 can be reduced. Meanwhile, the trajectory of the small droplets toward the opening 27 of the chamber 2 can be blocked at multiple stages on the trajectory OT.

In addition, in the case of the present embodiment, the direction in which the wire rod bundle 43 extends is different among the wire rod bundles 43 respectively arranged in the through-holes 70A of the shielding plates 70. Thus, the small droplets obtained by collision with the wire rod bundle 43 can be easily concentrated on the vicinity of the trajectory OT without being dispersed farther.

Moreover, in the case of the present embodiment, the absorber heater 51 configured to hold the shielding plates 70 at a temperature equal to or higher than the melting point of the droplet DL is provided at the absorber portion 11 of the collecting container 10. Thus, the small droplets, the motion energy of which is decreased, adhering to the shielding plates 70 are changed into liquid. As a result, diffusion of the small droplets adhering to the shielding plates 70 into the chamber 2 is avoided.

The collecting container 10 is heated such that the internal temperature of the collecting container 10 reaches equal to or higher than the melting point of the droplet DL.

5. Second Embodiment

5.1 Configuration of Droplet Collection Device

Next, a partial configuration in a droplet collection device will be described as a second embodiment. Note that the same reference signs are used to represent configurations similar to those described above, and unless otherwise stated, overlapping description is omitted.

Figure 6:
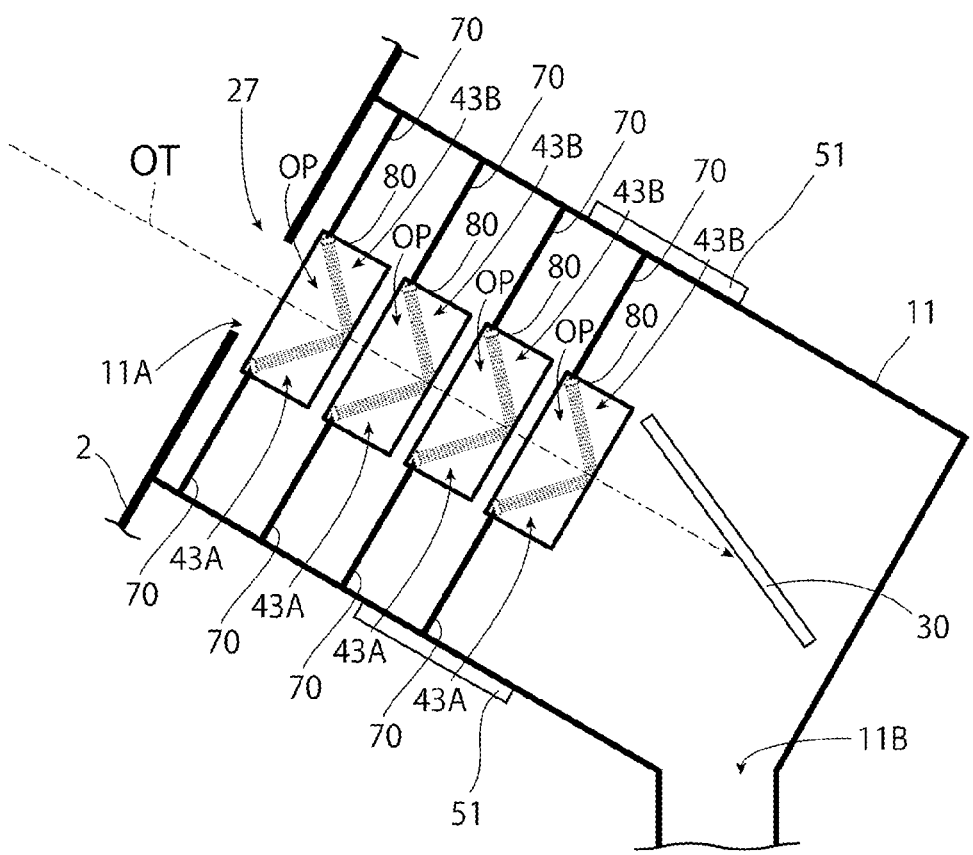
FIG. 6 is a schematic partial view of an outline configuration example of a droplet collection device of a second embodiment.

As illustrated in FIG. 6, in the droplet collection device of the present embodiment, each wire rod bundle 43 includes a pair of a first wire rod bundle 43A and a second wire rod bundle 43B, and sub-shielding plates 80 are newly provided.

The first wire rod bundle 43A includes multiple wire rods 41 and a fixture 42, and is arranged on one side with respect to a boundary which is a plane including a trajectory OT of a droplet DL. Moreover, the first wire rod bundles 43A are inclined with respect to the trajectory OT of the droplet DL, and are each arranged such that a free end side of the wire rod 41 of the first wire rod bundle 43A is away from an opening 27 of a chamber 2. One end side of the first wire rod bundle 43A is fixed to a peripheral edge portion of a through-hole 70A of a shielding plate 70 through the fixture 42 of the wire rod bundle 43A. The other end side of the wire rod bundle 43A is not fixed to the shielding plate 70, and therefore, is a free end.

The second wire rod bundle 43B includes multiple wire rods 41 and a fixture 42 as those of the first wire rod bundle 43A, and is arranged on the other side with respect to the boundary which is the plane including the trajectory OT of the droplet DL. Moreover, the second wire rod bundles 43B are inclined with respect to the trajectory OT of the droplet DL, and are each arranged such that a free end side of the wire rod 41 of the wire rod bundle 43B is away from the opening 27 of the chamber 2. One end side of the second wire rod bundle 43B is, through the fixture 42 of the wire rod bundle 43B, fixed to a peripheral edge portion of the shielding plate 70 on a side facing the peripheral edge portion of the through-hole 70A to which the wire rods 41 of the first wire rod bundle 43A are fixed. On the other hand, the other end side of the second wire rod bundle 43B is not fixed to the shielding plate 70, and therefore, is a free end. The other end side of the second wire rod bundle 43B intersects with the other end side of the first wire rod bundle 43A on the trajectory OT of the droplet DL.

Figure 7:
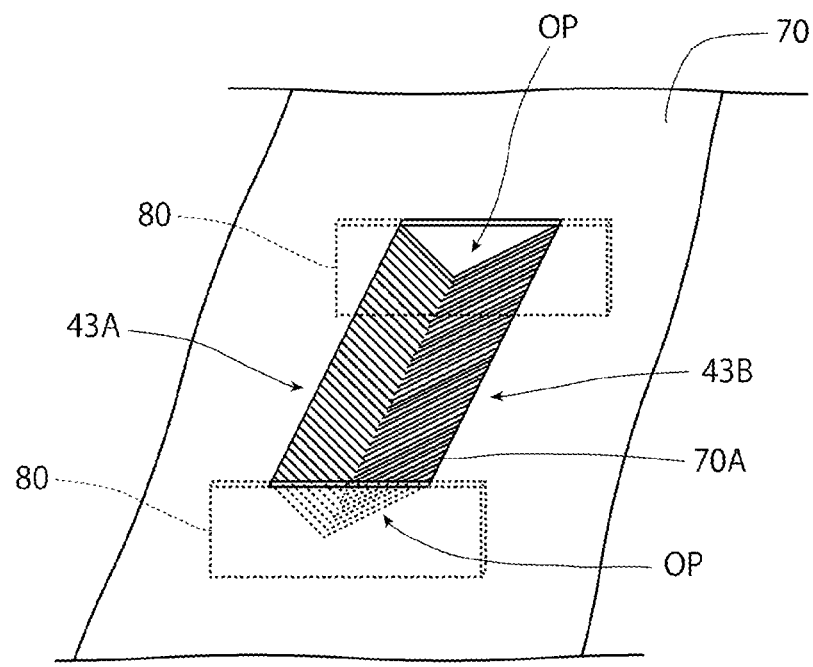
FIG. 7 is a schematic view mainly illustrating a through-hole portion of a shielding plate of the second embodiment.

As illustrated in FIG. 7, the sub-shielding plate 80 is a plate member configured to close an opening OP formed by the first wire rod bundle 43A, the second wire rod bundle 43B, and the shielding plate 70. The sub-shielding plate 80 may be formed integrally with the shielding plate 70, or may be formed separately from the shielding plate 70 and be fixed to the shielding plate 70. Note that the sub-shielding plate 80 may surround the peripheries of the first wire rod bundle 43A and the second wire rod bundle 43B, or may separately surround the periphery of the first wire rod bundle 43A and the periphery of the second wire rod bundle 43B.

The opening OP is a portion surrounded by a surface of the shielding plate 70, the first wire rod bundle 43A, and the second wire rod bundle 43B when the first wire rod bundle 43A, the second wire rod bundle 43B, and the shielding plate 70 are viewed from a direction in which the wire rods 41 of the first wire rod bundle 43A are arranged.

Moreover, the opening OP is surrounded by an end portion of the first wire rod bundle 43A in the direction in which the wire rods 41 of the first wire rod bundle 43A are arranged, an end portion of the second wire rod bundle 43B in such a direction, and a surface of the shielding plate 70 on a terminal end side of the trajectory OT of the droplet DL. Note that the direction in which the wire rods 41 are arranged is a direction substantially perpendicular to a longitudinal direction of the wire rod 41.

5.2 Operation

As in the first embodiment described above, the droplet DL having entered an absorber portion 11 through an inlet-side opening 11A of the absorber portion 11 comes into collision with the wire rods 41 of the first wire rod bundle 43A and the second wire rod bundle 43B arranged in the through-hole 70A of the shielding plate 70. The droplet DL colliding with the wire rods 41 is crushed into small droplets, and accordingly, motion energy decreases. In a case where two or more shielding plates 70 are arranged at mutually different positions on the trajectory OT of the droplet DL, the number of times of passage of the droplet DL through the wire rods 41 of the first wire rod bundle 43A and the second wire rod bundle 43B arranged at such positions increases. Thus, the droplet DL is crushed more finely, and therefore, the motion energy further decreases.

The small droplets with smaller motion energy collide with a collision plate 30, and therefore, become finer. Part of these droplets drop into a tank portion 12 through an outlet-side opening 11B of the absorber portion 11. For the small droplets scattered in the absorber portion 11 without dropping into the tank portion 12 from the collision plate 30, trajectories toward the opening 27 of the chamber 2 are blocked by the shielding plates 70 and the sub-shielding plates 80. Thus, these small droplets adhere to the shielding plate 70, the sub-shielding plate 80, or a wall of the absorber portion 11.

5.3 Feature/Advantageous Effect

As described above, in the droplet collection device of the present embodiment, in a case where a certain position at a side surface of the shielding plate 70 is viewed from the front, the wire rods 41 of the first wire rod bundle 43A and the wire rods 41 of the second wire rod bundle 43B are arranged in a V-shape. That is, the first wire rod bundle 43A arranged on one side with respect to the plane passing through the trajectory OT of the droplet DL and the second wire rod bundle 43B arranged on the other side with respect thereto are paired. Of the wire rods 41 of such a pair of the first wire rod bundle 43A and the second wire rod bundle 43B, the end portions on the free end side intersect with each other on the trajectory OT of the droplet DL. This can suppress the small droplets obtained by collision with the wire rods 41 of the first wire rod bundle 43A and the second wire rod bundle 43B from coming out to the opposite side of the surface of the shielding plate 70 on the terminal end side of the trajectory OT of the droplet DL.

Moreover, in the case of the present embodiment, the sub-shielding plate 80 configured to close the opening OP surrounded by the surface of the shielding plate 70, the first wire rod bundle 43A, and the second wire rod bundle 43B is provided. Thus, as compared to a case where no sub-shielding plates 80 are provided, a clearance formed between the terminal end side of the trajectory OT of the droplet DL and the opposite side thereof with respect to the shielding plate 70 as a boundary is reduced, and the small droplets toward the opening 27 of the chamber 2 are reduced by such clearance reduction. As a result, diffusion of the small droplets into the chamber 2 is further reduced.

6. Variations

The embodiments have been described above as examples. However, the present invention is not limited to the above-described embodiments, and the above-described embodiments may be changed.

Figure 8:
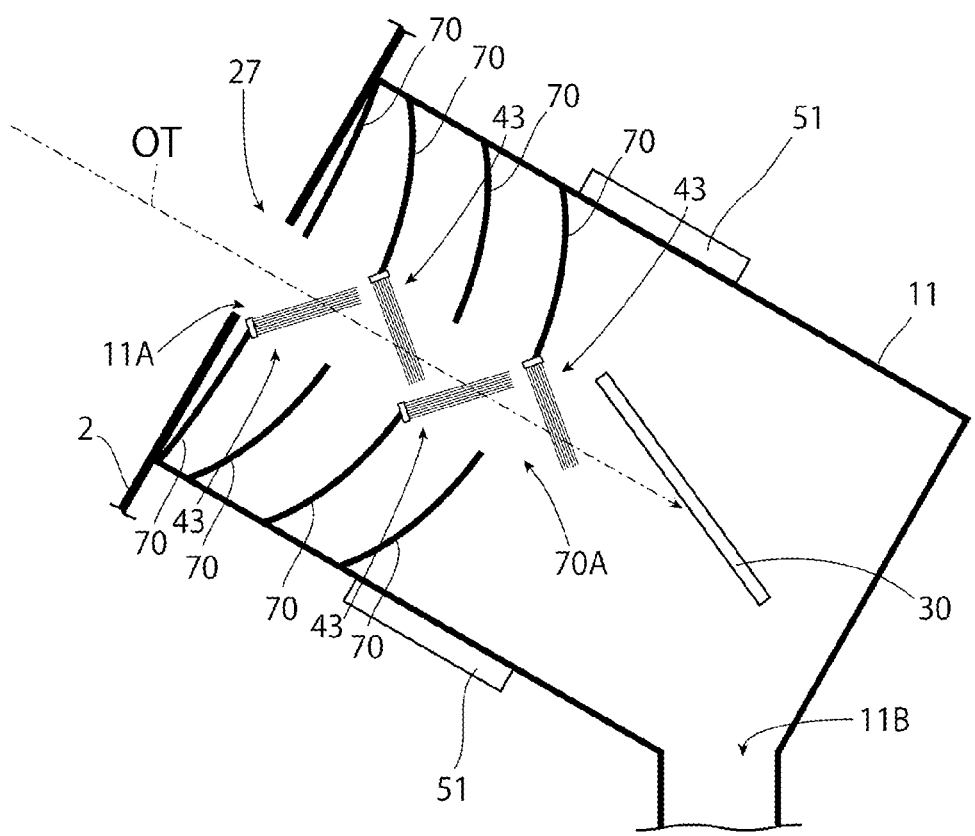
FIG. 8 is a schematic view of a state when each shielding plate is curved in the droplet collection device.

For example, in the first embodiment, the shielding plate 70 is a flat plate member, but as illustrated in FIG. 8, may be curved in a shape convexed toward the terminal end side of the trajectory OT of the droplet DL. Note that the shielding plate 70 of the second embodiment may also be curved in a shape convexed toward the terminal end side of the trajectory OT of the droplet DL. In a case where the shielding plate 70 is curved as described above, a small droplet adhering area can be increased as compared to the case of the flat shielding plate 70. Note that in a case where the shielding plates 70 are arranged at mutually different positions on the trajectory OT of the droplet DL, a small droplet amount increases toward the collision plate 30. Thus, the shielding plate 70 closest to the collision plate 30 may be curved, and other shielding plates 70 may be flat plate members. Alternatively, the degree of curvature may be different among the shielding plates 70. Alternatively, the degree of curvature of the shielding plate 70 may increase toward the collision plate 30.

Figure 9:
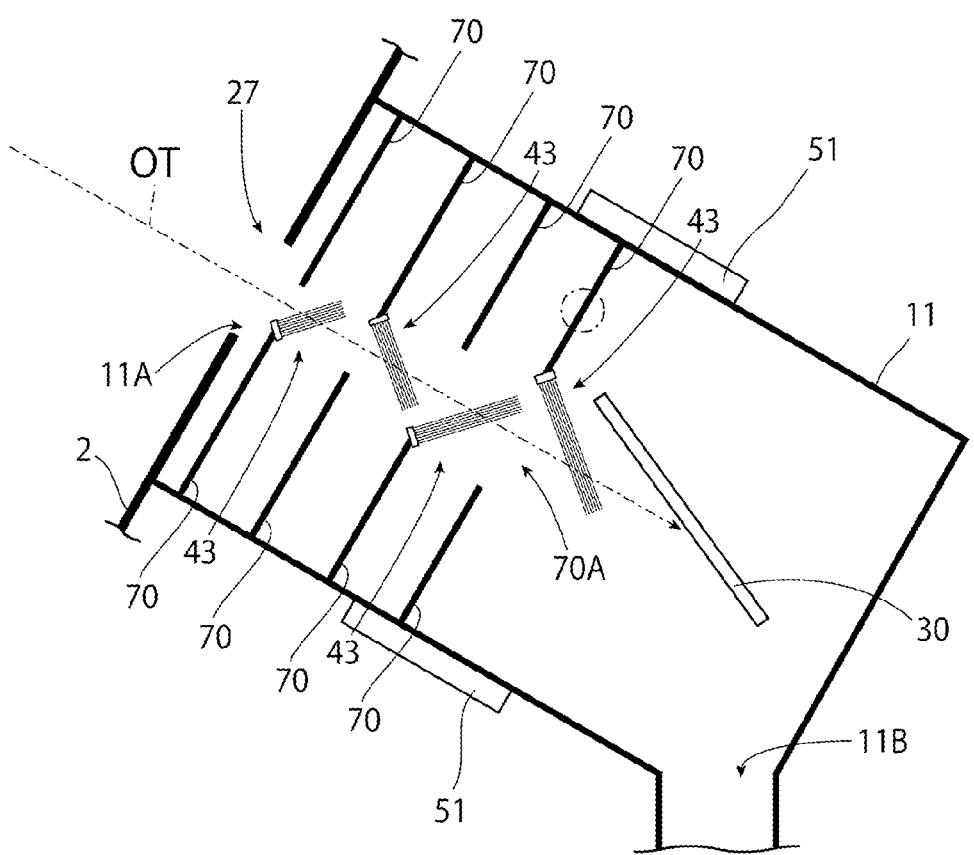
FIG. 9 is a schematic view of a state when a through-hole size is different among the shielding plates in the droplet collection device.

Moreover, in the first embodiment, in a case where the shielding plates 70 are arranged at mutually different positions on the trajectory OT of the droplet DL, the size of the through-hole 70A is the same among the shielding plates 70. However, as illustrated in FIG. 9, the through-hole 70A of the shielding plate 70 may be expanded with an increase in the distance from the opening 27 of the chamber 2. Note that the through-hole 70A of the shielding plate 70 in the second embodiment may also be expanded with an increase in the distance from the opening 27 of the chamber 2.

Figure 10:
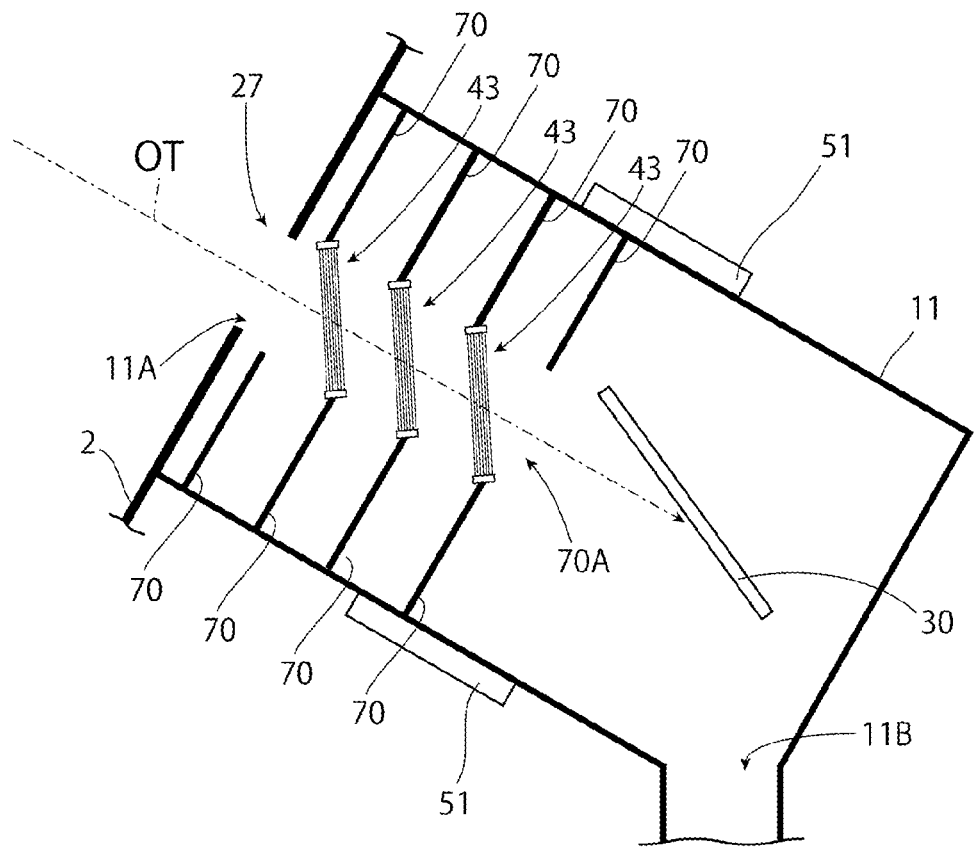
FIG. 10 is a schematic view of a state when both end portions of each wire rod bundle are fixed to the shielding plates in the droplet collection device.

Further, in the first embodiment, one end side of the wire rods 41 is fixed to the shielding plate 70 through the fixture 42. However, as illustrated in FIG. 10, both of one end side and the other end side of the wire rods 41 may be fixed with the fixtures 42, and may be fixed to the shielding plates 70 through the fixtures 42, respectively. In this case, the wire rods 41 may be arranged along a direction inclined with respect to the trajectory OT of the droplet DL. Note that in a case where the shielding plates 70 are arranged at mutually different positions on the trajectory OT of the droplet DL, the wire rods 41 may be arranged to extend over different shielding plates 70 as illustrated in FIG. 10. Further, at least the wire rods 41 closest to the collision plate 30 may be arranged along an inclination direction of the collision plate 30.

Figure 11:
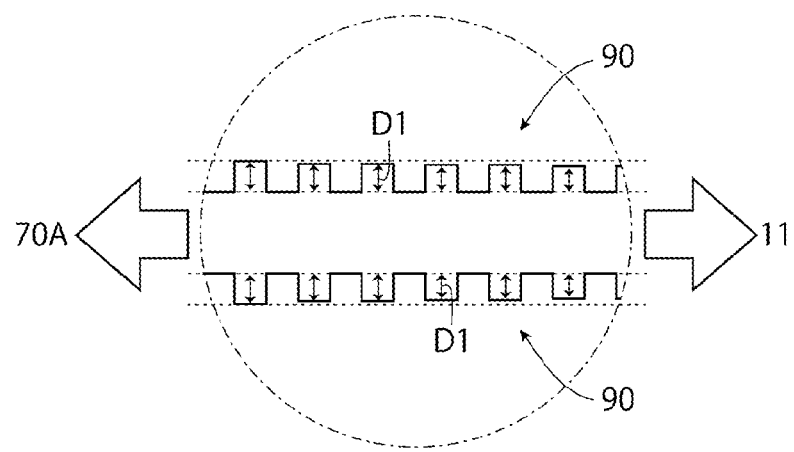
FIG. 11 is an enlarged schematic view of a partial section of the shielding plate surrounded by a chain line of FIG. 9.

In addition, in the above-described embodiments, the surface of the shielding plate 70 is flat. However, as in a partial section illustrated in FIG. 11, a recessed-raised portion 90 may be provided at the surface of the shielding plate 70, for example, on the terminal end side of the trajectory OT of the droplet DL. The recessed-raised portion 90 may include a groove, a dent, an island-shaped protrusion, etc. The section of the recessed-raised portion 90 is not necessarily in a rectangular shape, and may be in a wave shape or a saw shape, for example. Alternatively, the recessed-raised portion 90 may be formed at the surface of the shielding plate 70 on the opposite side of the terminal end side of the trajectory OT of the droplet DL. Note that the small droplet amount increases toward the through-hole 70A, and therefore, a height difference D1 at the recessed-raised portion preferably increases toward the through-hole 70A.

Description above is intended to provide mere examples without any limitations. Accordingly, it will be obvious to those skilled in the art that changes can be made to the embodiments and variations of the present disclosure without departing from the scope of the accompanying claims.

The terms used in the present specification and the entire scope of the accompanying claims should be construed as terms "without limitations". For example, a term "including" or "included" should be construed as "not limited to that described to include". A term "have" should be construed as "not limited to that described to have". Moreover, an indefinite article "a/an" described in the present specification and the accompanying claims should be construed to mean "at least one" or "one or more".

What is claimed is:

1. A droplet collection device comprising:
    a collecting container arranged on an outer wall surface side of a wall of a chamber and configured to communicate with an inside of the chamber through an opening provided at the wall of the chamber;
    a collision plate arranged in the collecting container and configured such that a droplet supplied from the opening to the collecting container is to collide with the collision plate;
    a shielding plate arranged on an opening side with respect to the collision plate and provided with a through-hole through which the droplet supplied to the collecting container passes; and
    a wire rod bundle arranged in the through-hole of the shielding plate in a state that multiple wire rods are bundled.

2. The droplet collection device according to claim 1, wherein
    an outer peripheral portion of the shielding plate is in close contact with an inner wall of the collecting container.

3. The droplet collection device according to claim 1, wherein
    the shielding plate is made of a material whose angle of contact with the droplet is equal to or less than 90°.

4. The droplet collection device according to claim 1, wherein
    the shielding plate is curved in a shape convexed toward a terminal end side of a trajectory of the droplet.

5. The droplet collection device according to claim 1, wherein
    the shielding plate includes multiple shielding plates arranged at mutually different positions on a trajectory of the droplet supplied to the collecting container, and
    the through-hole of each shielding plate is larger with an increase in a distance from the opening.

6. The droplet collection device according to claim 1, wherein
    one end side and the other end side of the wire rod bundle are fixed to the shielding plate, and
    the wire rod bundle is arranged along a direction inclined with respect to a trajectory of the droplet.

7. The droplet collection device according to claim 1, wherein
    one end side of the wire rod bundle is fixed to the shielding plate, and
    the wire rod bundle is inclined with respect to a trajectory of the droplet, and the other end side of the wire rod bundle is arranged away from the opening.

8. The droplet collection device according to claim 7, wherein
    the shielding plate includes multiple shielding plates arranged at mutually different positions on the trajectory of the droplet supplied to the collecting container, and a direction in which the wire rod bundle arranged in the through-hole of each shielding plate extends is different among the wire rod bundles.

9. The droplet collection device according to claim 7, wherein
a first wire rod bundle arranged on one side with respect to a boundary which is a plane including the trajectory of the droplet and a second wire rod bundle arranged on the other side with respect to the plane are paired, and the other ends of the paired wire rod bundles intersect with each other on the trajectory of the droplet.

10. The droplet collection device according to claim 9, further comprising:
a sub-shielding plate configured to close at least an opening surrounded by a surface of the shielding plate and the paired wire rod bundles when the paired wire rod bundles and the shielding plate are viewed from a direction parallel to the surface of the shielding plate on a terminal end side of the trajectory of the droplet.

11. The droplet collection device according to claim 1, further comprising:
a heater provided at the collecting container and configured to hold the shielding plate at a temperature equal to or higher than a melting point of the droplet.

12. The droplet collection device according to claim 11, wherein
a recessed-raised portion is provided at at least part of a surface of the shielding plate.

13. The droplet collection device according to claim 12, wherein
a height difference at the recessed-raised portion increases toward the through-hole.

* * * * *